US012787558B2

(12) United States Patent
Sun et al.

(10) Patent No.: US 12,787,558 B2
(45) Date of Patent: Nov. 3, 2026

(54) DISPLAY PANEL WITH HOLLOWED-OUT TRANSPARENT HEAT INSULATING LAYER AND METHOD OF MANUFACTURING THE SAME

(71) Applicant: BOE TECHNOLOGY GROUP CO., LTD., Beijing (CN)

(72) Inventors: Qian Sun, Beijing (CN); Qian Jin, Beijing (CN); Yu Tian, Beijing (CN); Yang Li, Beijing (CN); Tianhao Lu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 400 days.

(21) Appl. No.: 18/565,256

(22) PCT Filed: Jun. 17, 2021

(86) PCT No.: PCT/CN2021/100704
§ 371 (c)(1),
(2) Date: Nov. 29, 2023

(87) PCT Pub. No.: WO2022/261904
PCT Pub. Date: Dec. 22, 2022

(65) Prior Publication Data
US 2024/0268159 A1 Aug. 8, 2024

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/126* (2023.02); *H10K 59/38* (2023.02)

(58) Field of Classification Search
CPC .. H10K 59/122; H10K 59/1201; H10K 59/38; H10K 59/126
See application file for complete search history.

(56) References Cited

U.S. PATENT DOCUMENTS 7,288,420 B1 * 10/2007 Yamazaki ........... H10K 71/135
257/E27.111
11,462,599 B2 * 10/2022 Hsu ...................... H10K 59/805
(Continued)

FOREIGN PATENT DOCUMENTS

CN 106299076 A 1/2017
CN 108428775 A 8/2018
(Continued)

*Primary Examiner* — Lex H Malsawma
(74) *Attorney, Agent, or Firm* — WHDA, LLP

(57) ABSTRACT

A display panel includes: a driving substrate, a pixel definition layer, multiple light-emitting elements, a first encapsulation layer, a transparent heat insulation layer, a pixel isolation structure and a color conversion layer. The pixel definition layer includes multiple first pixel partitions arranged in an array form, and multiple first pixel regions are enclosed by adjacent first pixel partitions. The transparent heat insulation layer is arranged on a side of the first encapsulation layer away from the driving substrate, an orthographic projection of the transparent heat insulation layer onto the driving substrate at least covers an orthographic projection of each first pixel region onto the driving substrate. The pixel isolation structure includes multiple second pixel partitions arranged in an array form, multiple second pixel regions are enclosed by adjacent second pixel partitions.

18 Claims, 14 Drawing Sheets

(51) Int. Cl.
*H10K 59/126* (2023.01)
*H10K 59/38* (2023.01)

(56) References Cited

U.S. PATENT DOCUMENTS

| | | | | |
|---|---|---|---|---|
| 2004/0151829 | A1* | 8/2004 | Boroson | H10K 71/18 427/64 |
| 2006/0022589 | A1* | 2/2006 | Cok | H10K 50/87 313/506 |
| 2016/0087245 | A1* | 3/2016 | Park | H10K 59/878 257/40 |
| 2017/0176816 | A1* | 6/2017 | Han | G02F 1/133621 |
| 2017/0254933 | A1* | 9/2017 | Li | G02B 5/20 |
| 2017/0255056 | A1* | 9/2017 | Liu | G02F 1/133512 |
| 2018/0233625 | A1 | 8/2018 | Jung et al. | |
| 2019/0302917 | A1 | 10/2019 | Pan | |
| 2020/0020746 | A1* | 1/2020 | Bae | H10K 59/38 |
| 2020/0161579 | A1* | 5/2020 | Kim | H10K 59/126 |
| 2020/0241356 | A1* | 7/2020 | Yang | G02F 1/133516 |
| 2021/0343971 | A1 | 11/2021 | Mizusaki | |
| 2021/0408180 | A1* | 12/2021 | Hsu | H10K 50/16 |

FOREIGN PATENT DOCUMENTS

| | | | |
|---|---|---|---|
| CN | 110071144 | A | 7/2019 |
| CN | 110729323 | A | 1/2020 |
| CN | 111508991 | A | 8/2020 |
| CN | 112640577 | A | 4/2021 |
| CN | 112802940 | A | 5/2021 |

* cited by examiner

DISPLAY PANEL WITH HOLLOWED-OUT TRANSPARENT HEAT INSULATING LAYER AND METHOD OF MANUFACTURING THE SAME

CROSS-REFERENCE TO RELATED APPLICATION

The present application is the U.S. national phase of PCT Application No. PCT/CN2021/100704 filed on Jun. 17, 2021, which is incorporated by reference herein in its entirety.

TECHNICAL FIELD

The present disclosure relates to the field of display technology, in particular to a display panel, a method for manufacturing the display panel, and a display device.

BACKGROUND

At present, QD-OLED (Quantum dot-Organic Light Emitting Display) panel is a new display technology, and a working principle thereof is the combination of a quantum dot conversion film and an OLED. In the original framework of the OLED screen, a layer of quantum dot conversion film is added. The quantum dot conversion film is configured to convert the wavelength of light emitted by the OLED.

SUMMARY

Embodiments of the present disclosure provide a display panel, including:

- a driving substrate;
- a pixel definition layer arranged at one side of the driving substrate, where the pixel definition layer includes a plurality of first pixel partitions arranged in an array form, and a plurality of first pixel regions are enclosed by adjacent first pixel partitions;
- a plurality of light-emitting elements arranged in corresponding first pixel regions;
- a first encapsulation layer covering the pixel definition layer and the plurality of light-emitting elements;
- a transparent heat insulation layer arranged on a side of the first encapsulation layer away from the driving substrate, where an orthographic projection of the transparent heat insulation layer onto the driving substrate at least covers an orthographic projection of each first pixel region onto the driving substrate;
- a pixel isolation structure arranged on a side of the transparent beat insulation layer away from the driving substrate, where the pixel isolation structure includes a plurality of second pixel partitions arranged in an array form, a plurality of second pixel regions are enclosed by adjacent second pixel partitions, and the second pixel regions correspond to the first pixel regions; and
- a color conversion layer including a plurality of color conversion parts provided in corresponding second pixel regions.

Optionally, in the display panel of the embodiments of the present disclosure, the transparent heat insulation layer has a plurality of hollowed-out parts and a plurality of heat insulation parts, and an orthographic projection of each heat insulation part onto the driving substrate covers an orthographic projection of a corresponding first pixel region onto the driving substrate.

Optionally, in the display panel of the embodiments of the present disclosure, the display panel further includes a first light shielding layer, the first light shielding layer includes light shielding parts filling the hollowed-out parts, and an orthographic projection of the pixel isolation structure onto the driving substrate covers orthographic projections of the light shielding parts onto the driving substrate.

Optionally, in the display panel of the embodiments of the present disclosure, a material of the first light shielding layer is a positive photoresist, a material of the transparent heat insulation layer is a negative photoresist with thermal insulation properties, or a material of the transparent heat insulation layer includes a negative photoresist body and a phase change material mixed in the negative photoresist body.

Optionally, in the display panel of the embodiments of the present disclosure, in a thickness direction of the driving substrate, a cross-sectional shape of at least one light shielding part is substantially a right trapezoid, and a cross-sectional shape of the heat insulation part is substantially an inverted trapezoid.

Optionally, in the display panel of the embodiments of the present disclosure, the phase change material is an organic phase change material, and the organic phase change material includes paraffin, medium-long-chain fatty acids, polyolefins or alcohols.

Optionally, in the display panel of the embodiments of the present disclosure, the first light shielding layer and the transparent heat insulation layer ach has a thickness of 2 μm to 3 μm.

Optionally, in the display panel of the embodiments of the present disclosure, a thickness of the pixel isolation structure is 2-5 times the thickness of the transparent heat insulation layer.

Optionally, in the display panel of the embodiments of the present disclosure, a color of the pixel isolation structure is one of black, yellow or gray.

Optionally, in the display panel of the embodiments of the present disclosure, the pixel isolation structure has inorganic nanoparticles therein for scattering light entering sidewalls of the pixel isolation structure.

Optionally, in the display panel of the embodiments of the present disclosure, the pixel isolation structure is made of a same material as the light shielding parts, and the pixel isolation structure and the light shielding parts form a one-piece structure.

Optionally, in the display panel of the embodiments of the present disclosure, the display panel further includes: a second encapsulation layer covering the color conversion layer and the pixel isolation structure, a plurality of color filter parts arranged on a side of the second encapsulation layer away from the driving substrate and corresponding to the color conversion parts, and a second light shielding layer arranged between the color filter parts.

Accordingly, embodiments of the present disclosure further provide a display device including the display panel.

Optionally, in the display device of the embodiments of the present disclosure, the display device further includes a cover plate covering the display panel.

Accordingly, embodiments of the present disclosure further provide a method for manufacturing the display panel, including:

- providing a driving substrate;
- forming a pixel definition layer on the driving substrate: where the pixel definition layer includes a plurality of first pixel partitions arranged in an array form, and a plurality of first pixel regions are enclosed by adjacent first pixel partitions;

forming corresponding light-emitting elements in the first pixel regions;

forming a first encapsulation layer covering the pixel definition layer and the light-emitting elements;

forming a transparent heat insulation layer on a side of the first encapsulation layer away from the driving substrate; where an orthographic projection of the transparent heat insulation layer onto the driving substrate at least covers an orthographic projection of each first pixel region onto the driving substrate;

forming a pixel isolation structure on a side of the transparent heat insulation layer away from the driving substrate, where the pixel isolation structure includes a plurality of second pixel partitions arranged in an array form, a plurality of second pixel regions are enclosed by adjacent second pixel partitions, and the second pixel regions are arranged corresponding to the first pixel regions; and forming corresponding color conversion parts in the second pixel regions.

Optionally, in the method of the embodiments of the present disclosure, the forming a pixel isolation structure on a side of the transparent heat insulation layer away from the driving substrate, specifically includes:

forming a pixel isolation material film layer on a side of the transparent heat insulation layer away from the driving substrate through a deposition process;

performing exposure and development on the pixel isolation material film layer to form a pixel isolation material film layer including a plurality of second pixel partitions arranged in an array form; and performing first heat curing on the pixel isolation material film layer on a side of the pixel isolation material film layer away from the transparent heat insulation layer to form the pixel isolation structure.

Optionally, in the method of the embodiments of the present disclosure, before forming the pixel isolation structure, the method further includes:

forming a first light shielding material film layer on a side of the transparent heat insulation layer away from the driving substrate through a deposition process;

performing exposure and development on the first light shielding material film layer to form a first light shielding material filling hollowed-out parts;

performing second heat curing on the first light shielding material on a side of the first light shielding material film layer away from the transparent heat insulation layer to form light shielding parts.

Optionally, in the method of the embodiments of the present disclosure, the transparent heat insulation layer and the first light shielding layer are formed by using a same mask.

Optionally, in the method of the embodiments of the present disclosure, a temperature of the first heat curing is greater than a temperature of the second heat curing.

BRIEF DESCRIPTION OF THE DRAWINGS

In order to illustrate the technical solutions of the embodiments of the present disclosure in a clearer manner, the drawings required for the description of the embodiments of the present disclosure will be described hereinafter briefly. Apparently, the following drawings merely relate to some embodiments of the present disclosure, and based on these drawings, a person of ordinary skill in the art may obtain other drawings without any creative effort.

DETAILED DESCRIPTION

Figure 1:
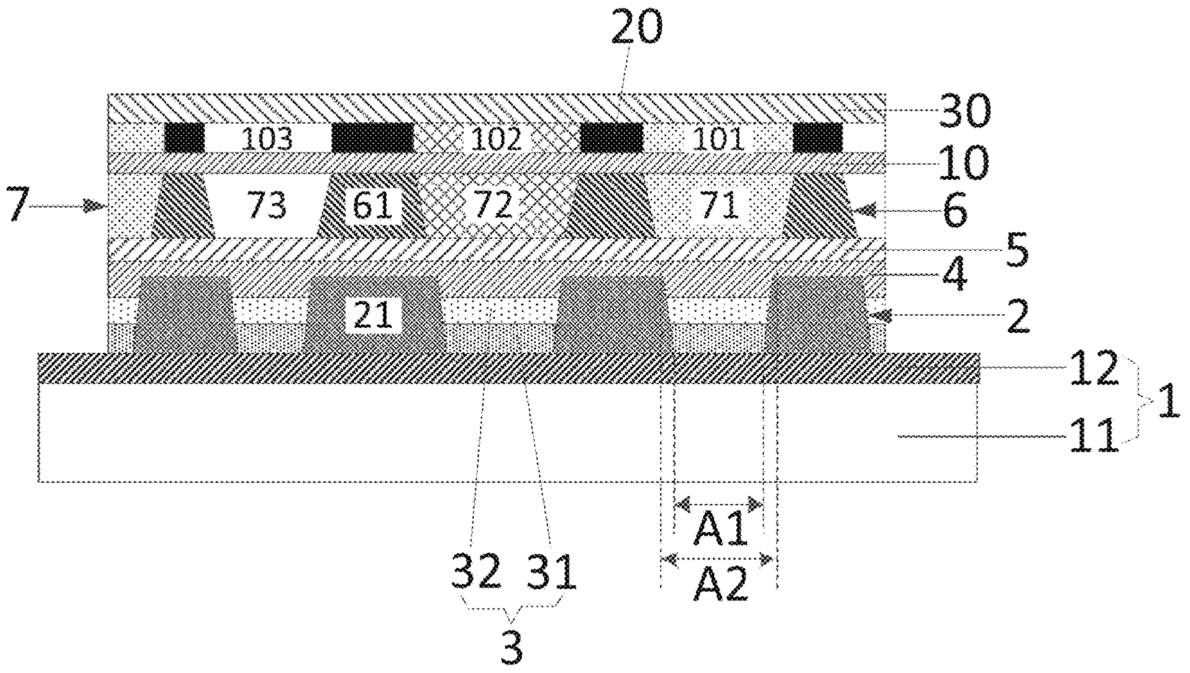
FIG. 1 is a schematic view showing a display panel according to one embodiment of the present disclosure.

In order to make the objects, the technical solutions and the advantages of the present disclosure more apparent, the present disclosure will be described hereinafter in a clear and complete manner in conjunction with the drawings and embodiments. Apparently, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection.

It should be noted that the sizes and shapes of the various figures in the drawings do not reflect true proportions, and are intended only to illustrate the present disclosure. And the same or similar reference numerals denote the same or similar elements or elements having the same or similar functions throughout.

QD-OLED (Quantum dot-Organic Light Emitting Display) device structures may be divided into two types, one is a cell-alignment type, namely, a blue OLED and a QD conversion layer are formed on two substrates respectively, and are then arranged oppositely to form a cell. Usually, a cell-alignment device structure is relatively thick due to a filling layer such as filler, etc. and such issues as crosstalk may easily occur. The other QD-OLED structure adopts a Color Filter on Encap (COE) technology, i.e., a filter is encapsulated on the light-exiting side of the OLED display panel. Since the filter can filter light, it is able to reduce the amount of ambient light entering the OLED display panel which is emitted from the light-emitting side after being reflected by an internal structure of the OLED display panel. In addition, this structure has a reduced cell thickness and a higher color gamut. Various filters with different colors in the COE technology need to be defined by a pixel isolation structure (e.g., one or more banks), namely, it requires to form banks on the OLED. Usually, the banks are made of a resin, and the resin is cured at a temperature of above 180° C. However, a high-temperature curing would have an adverse effect on the performance of the OLED and a thin-film transistor (TFT) under the resin. In a case that a low-temperature curing of 85° C. is used, the curing is incomplete, resulting in the QD ink penetrating through the bank to an adjacent pixel. Thus, crosstalk occurs.

In view of this, embodiments of the present disclosure provide a display panel, as shown in FIGS. 1-5, including:

- a driving substrate 1;
- a pixel definition layer 2 arranged at one side of the driving substrate 1, where the pixel definition layer 2 includes a plurality of first pixel partitions 21 arranged in an array form, and a plurality of first pixel regions A1 are enclosed by adjacent first pixel partitions 21;
- a plurality of light-emitting elements 3 arranged in corresponding first pixel regions A1;
- a first encapsulation layer 4 covering the pixel definition layer 2 and the plurality of light-emitting elements 3;
- a transparent heat insulation layer 5 arranged on a side of the first encapsulation layer 4 away from the driving substrate 1, where an orthographic projection of the transparent heat insulation layer 5 onto the driving substrate 1 at least covers an orthographic projection of each first pixel region A1 onto the driving substrate 1;
- a pixel isolation structure 6 arranged on a side of the transparent heat insulation layer 5 away from the driving substrate 1, where the pixel isolation structure 6 includes a plurality of second pixel partitions 61 arranged in an array form, a plurality of second pixel regions A2 are enclosed by adjacent second pixel partitions 61, and the second pixel regions A2 correspond to the first pixel regions A1;
- a color conversion layer 7 including a plurality of color conversion parts (71, 72 and 73), where the plurality of color conversion parts (71, 72 and 73) are provided in corresponding second pixel regions A2.

In the display panel of the embodiments of the present disclosure, when the transparent heat insulation layer 5 is arranged on the side of the first encapsulation layer 4 away from the driving substrate 1, it is able for the transparent heat insulation layer 5 to protect the light-emitting elements 3 below the first encapsulation layer 4 from high temperature damage, so that when the pixel isolation structure 6 is subsequently formed, a high temperature curing process can be used to ensure that the material of the pixel isolation structure 6 is fully cured, thereby to address the issue of crosstalk occurring for the color conversion layer 7 caused by the incomplete curing of the pixel isolation structure 6.

During the implementation, in the display panel of the embodiments of the present disclosure, as shown in FIG. 1, the transparent heat insulation layer 5 may be a structure arranged to be corresponding to an entire face, so as to protect the light-emitting elements 3 thereunder from high-temperature damage, thereby to improve the light-emitting performance.

During the implementation, since the light-emitting element emits light at a certain angle, for example, 120° C., light reflected by the light-emitting element not only enters the corresponding color conversion part above the light-emitting element, but also enters the adjacent color conversion part, crosstalk easily occurs. In order to address the issue of crosstalk, in the display panel of the embodiments of the present disclosure, as shown in FIGS. 2-5, the transparent heat insulation layer 5 may have a plurality of hollowed-out parts and a plurality of heat insulation parts 51, and the orthographic projection of each heat insulation part 51 onto the driving substrate 1 covers an orthographic projection of a corresponding first pixel region A1 onto the driving substrate 1. In this way, it is able for the heat insulation part 51 to protect the light-emitting elements 3 thereunder from high-temperature damage, and it is able to address the issue of crosstalk through light shielding parts in the hollowed-out parts.

During the implementation, in the display panel of the embodiments of the present disclosure, as shown in FIGS. 2-5, the display panel further includes a first light shielding layer 8, the first light shielding layer 8 includes light shielding parts 81 filling the hollowed-out parts, and an orthographic projection of the pixel isolation structure 6 onto the driving substrate 1 covers orthographic projections of the light shielding parts 81 onto the driving substrate 1. Thus, it is able to avoid the occurrence of crosstalk between adjacent pixels through the light shielding parts 81 filled in the hollowed-out parts of the transparent heat insulation layer 5. In addition, the heat insulation parts 51 are formed before the light shielding parts 81, the light shielding parts 81 need to be cured through post bake at a high temperature, so it requires to form the heat insulation parts 51 first to protect the light-emitting elements 3, and then form the light shielding parts 81. Next, the display panel is turned over and cured, thereby reducing thermal damage to the light-emitting elements.

Specifically, as shown in FIGS. 2 to 5, the light shielding part 81 may have a same thickness as the heat insulation part 51.

During the implementation, photoresists are generally divided into a positive photoresist and a negative photoresist. The positive photoresist has an approximately normal trapezoidal shape after exposure and development, and the negative photoresist has an approximately inverted trapezoidal shape after exposure and development. With regard to a COE-type structure, in view of practical light-emitting considerations, as shown in FIGS. 2-5, it is desirable that the light shielding part 81 is a normal trapezoid, so the light shielding part 81 is preferably formed by using the positive photoresist through exposure and development, while the heat insulation part 51 is formed by using the negative photoresist through exposure and development. Therefore, in the display panel of the embodiments of the present disclosure, as shown in FIGS. 2-5, the first light shielding layers 8 are made of a positive photoresist, the transparent heat insulation layers 5 are made of a negative photoresist with thermal insulation properties, and the negative photoresist with thermal insulation properties itself has thermal insulation properties, so that the light-emitting elements 3 can be protected from high temperature damage. Alternatively, the material of the transparent heat insulation layer 5 includes a negative photoresist body and a phase change material mixed in the negative photoresist body, the phase change material absorbs heat during the heating, e.g., changing from one form to another form to achieve heat absorption, so it is able to solve the problem of poor low-temperature curing of the pixel isolation structure 6 and the light shielding part 81 in the embodiments of the present disclosure, and absorb heat generated by the light-emitting elements 3 during the subsequent device use.

Specifically, as shown in FIGS. 2-5, since the light shielding part 81 is formed by using the positive photoresist through exposure and development, and the heat insulation part 51 is formed by using the negative photoresist through exposure and development, namely, the light shielding part 81 and the heat insulation part 51 are formed by using photoresists with opposite photolithographic properties, the light shielding part 81 and the heat insulation part 51 can be directly formed by using a same mask, thereby saving one mask and saving costs.

During the specific implementation, the light shielding part 81 may also be formed by using the negative photoresist through exposure and development, and the heat insulation part 51 may be formed by using the positive photoresist through exposure and development.

During the implementation, in the display panels of the embodiments of the present disclosure, the phase change material may be an organic phase change material, which may include, but is not limited to, paraffins, medium-long-chain fatty acids, polyolefins, or alcohols.

Figure 4:
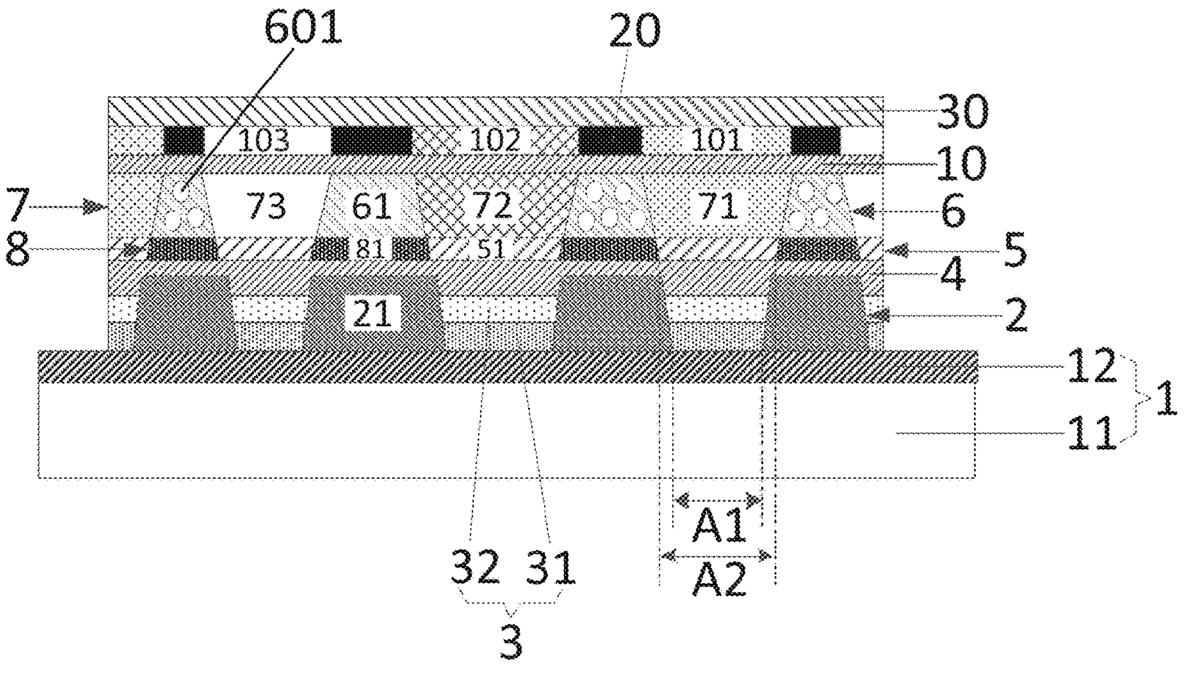
FIG. 4 is still yet another schematic view showing the display panel according to one embodiment of the present disclosure.
Figure 5:
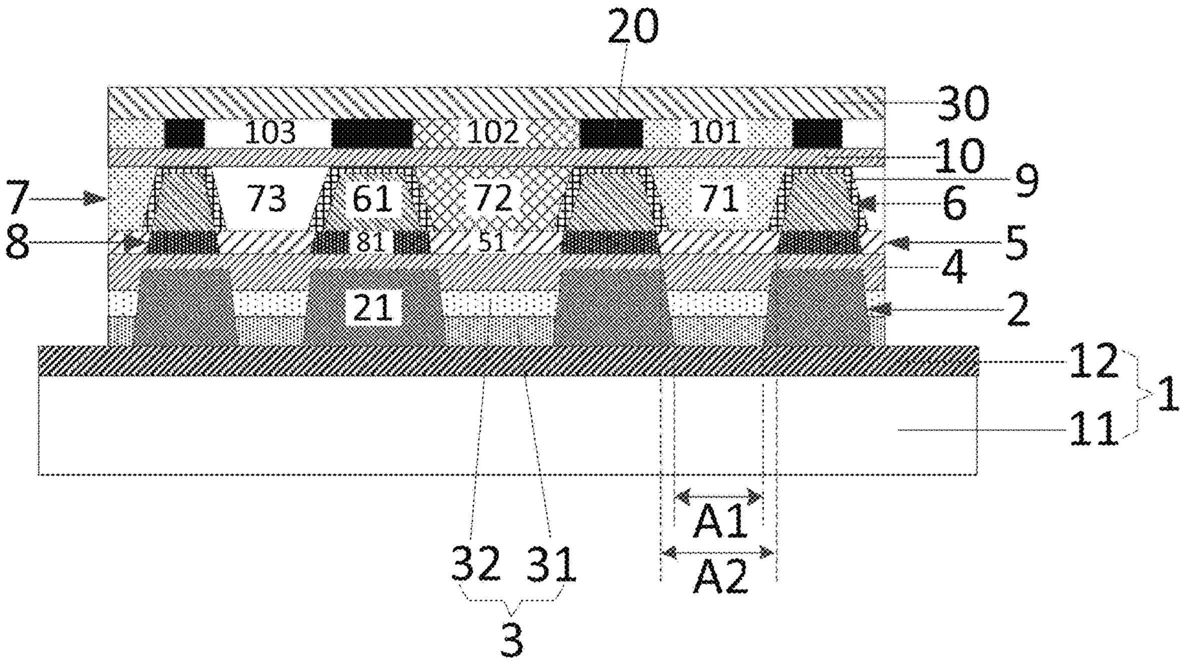
FIG. 5 is still yet another schematic view showing the display panel according to one embodiment of the present disclosure.
Figure 6A:
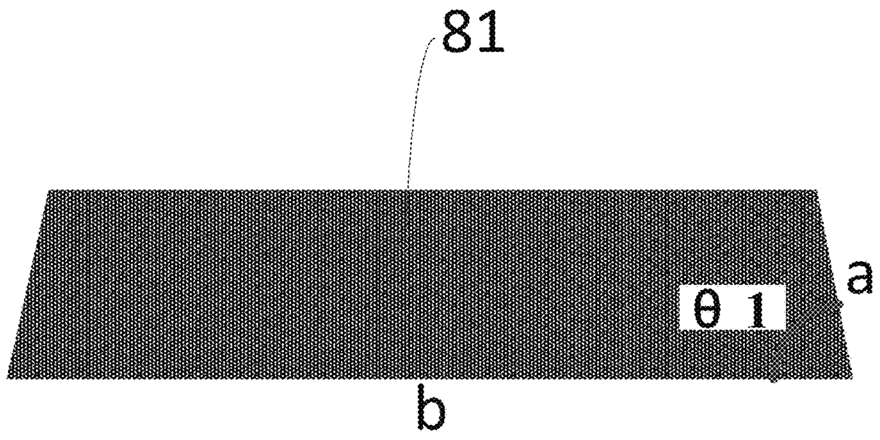
FIG. 6A is an enlarged view of a light shielding part in the display panel according to one embodiment of the present disclosure.
Figure 6B:
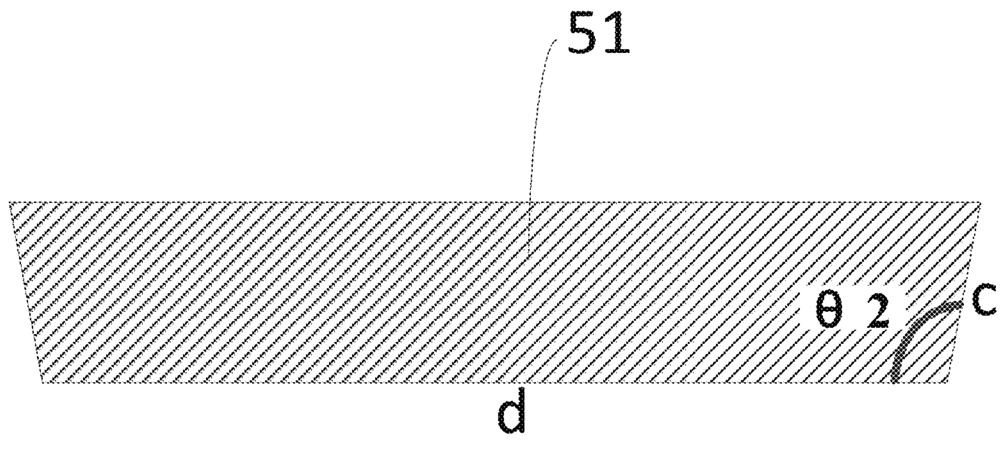
FIG. 6B is an enlarged view of a heat insulation part in the display panel according to one embodiment of the present disclosure.

During the implementation, in the display panel of the embodiments of the present disclosure, as shown in FIGS. 2-5, since the first light shielding layer 8 is made of the positive photoresist, and the transparent heat insulation layer 5 is made of the negative photoresist, along a thickness direction of the driving substrate 1, a cross-sectional shape of the light shielding part 81 is substantially a normal trapezoid, namely, an included angle θ1 between a tangent line of a side edge a and a tangent line of a bottom edge b in a cross section of the light shielding part 81 is less than 90 degrees, as shown in FIG. 6A. A cross-sectional shape of the heat insulation part 51 is substantially an inverted trapezoid, i.e., an angle θ2 between a tangent line of a side edge c and a tangent line of a bottom edge d in a cross section of the heat insulation part 51 is greater than 90 degrees, as shown in FIG. 6B. As a result, it is able to increase a light-exiting angle of the light-emitting element 3.

During the implementation, in the display panel of the embodiments of the present disclosure, as shown in FIGS. 2-5, a thermal conductivity of the heat insulation part 51 is less than 0.1 W/m·K, the light transmittance in the visible light band (380 mm-780 nm) is greater than 97%, and an included angle θ3 between the tangent line of the side edge c and the tangent line of the bottom edge d in the cross section of the heat insulation part 51 in the thickness direction of the driving substrate 1 may be 90°-110°, as shown in FIG. 6B. The light shielding part 81 has an absorbance of more than 95% for light in the visible light band (380 nm to 780 nm).

During the implementation, in the display panel of the embodiments of the present disclosure, as shown in FIGS. 1 to 5, the first light shielding layer 8 and the transparent heat insulation layer 5 each has a thickness of 2 μm to 3 μm.

During the implementation, in the display panel of the embodiments of the present disclosure, as shown in FIGS. 1 to 5, a thickness of the pixel isolation structure 6 is 2 to 5 times the thickness of the transparent heat insulation layer 5. Specifically, the smaller the thickness multiple relationship, the larger a separation distance between the color conversion part and the light-emitting element, resulting in crosstalk. In a case that a multiple of the thickness is too large, the transparent heat insulation layer 5 may be unable to provide heat insulating effect, impairing the performance of the light-emitting element.

Figure 2:
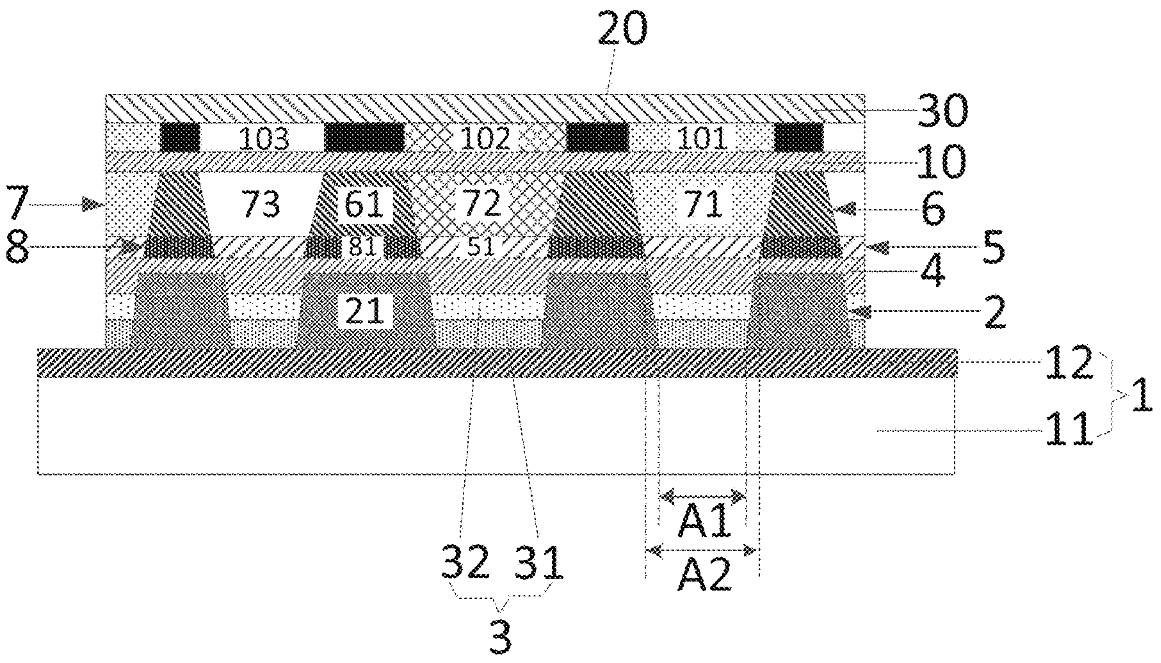
FIG. 2 is another schematic view showing the display panel according to one embodiment of the present disclosure.
Figure 3:
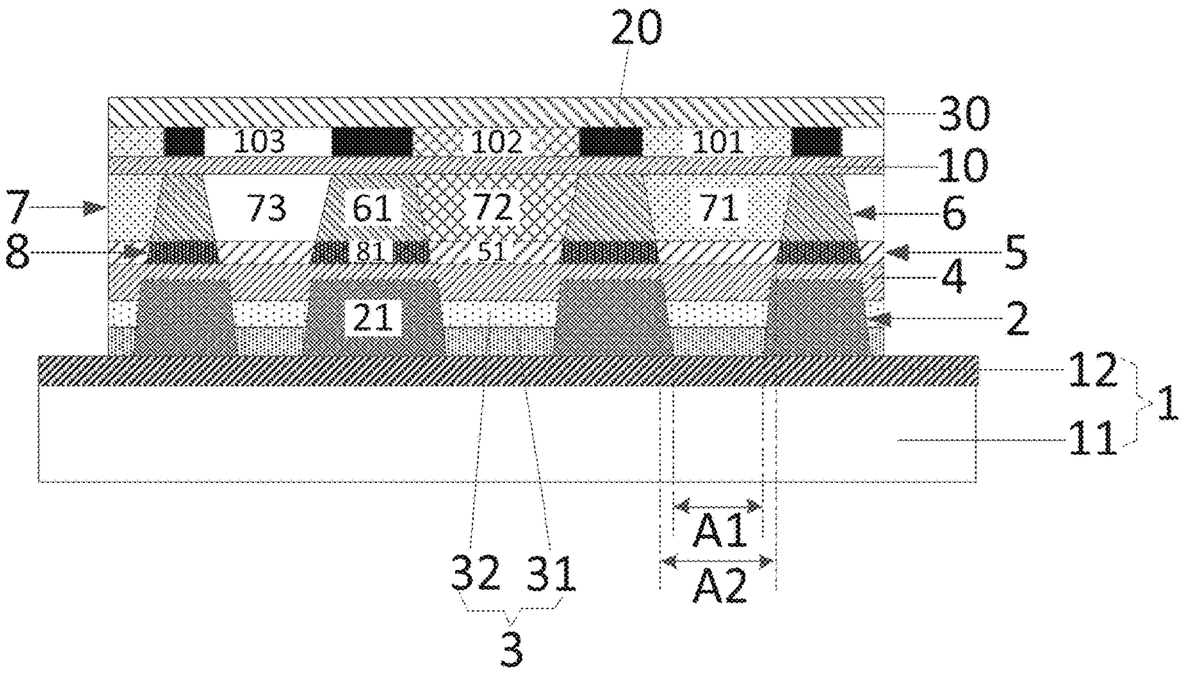
FIG. 3 is yet another schematic view showing the display panel according to one embodiment of the present disclosure.

During the implementation, in the display panel of the embodiments of the present disclosure, a color of the pixel isolation structure may be one of black, yellow or gray, a thickness of the pixel isolation structure may be 7 μm-10 μm, preferably 9 μm-10 μm, and the absorbance of light in the visible light band (380 nm-780 nm) is greater than 95%. Specifically, a black pixel isolation structure has a stronger capability to absorb light than yellow and grey pixel isolation structures, and in a case that the efficiency of light emission of the color conversion layer is to be improved, the color of the pixel isolation structure may be set as yellow or grey. In a case that the device is to be prevented from being adversely affected by external ambient light, the color of the pixel isolation structure may be set to black. In other words, the color of the pixel isolation structure is selected according to actual needs. For example, as shown in FIG. 2, the color of the pixel isolation structure 6 is black. As shown in FIGS. 3 and 5, the color of the pixel isolation structure 6 is yellow. As shown in FIG. 4, the color of the pixel isolation structure 6 is grey.

Figure 6C:
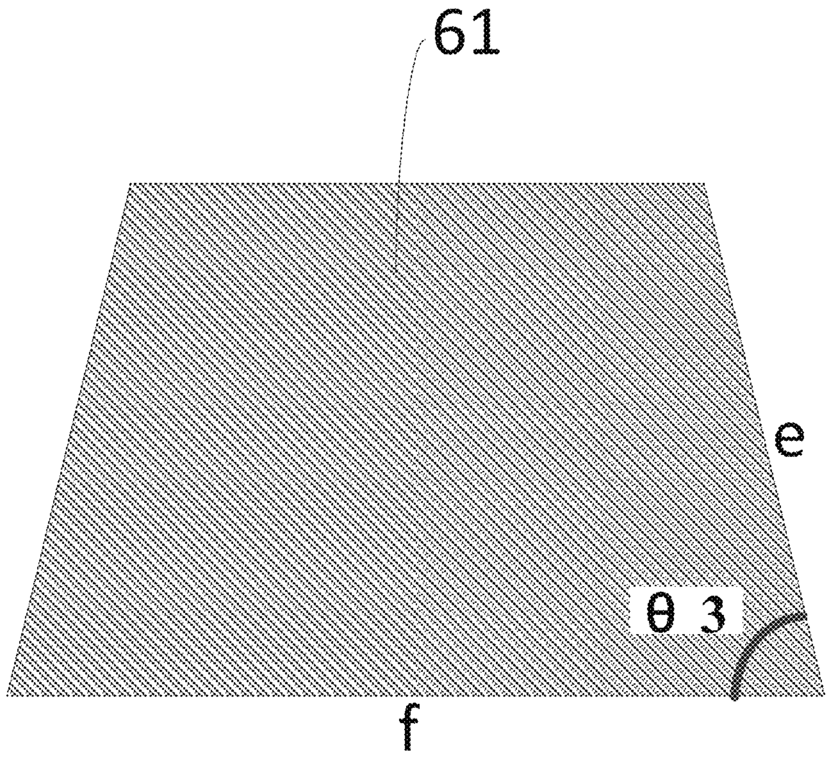
FIG. 6C is an enlarged view of a second pixel partition in the display panel according to one embodiment of the present disclosure.

During the implementation, as shown in FIGS. 2 to 5, an angle θ3 between a tangent line of a side edge e and a tangent line of a bottom edge fin a cross section of the second pixel partition 61 in the thickness direction of the driving substrate 1 may be 60° to 85°, as shown in FIG. 6C.

During the implementation, in the display panel of the embodiments of the present disclosure, the pixel isolation structure 6 may further have inorganic nanoparticles therein, as exemplified by the gray pixel isolation structure 6 shown in FIG. 4 having inorganic nanoparticles 601. Usually, the inorganic nanoparticles have a scattering effect, and are used for scattering light entering sidewalls of the pixel isolation structure 6. Therefore, through the pixel isolation structure 6 doped with inorganic nanoparticles, it is able to improve the light efficiency utilization rate of the color conversion layer and improve the display effect.

During the implementation, in the display panel of the embodiments of the present disclosure, as shown in FIG. 4, the inorganic nanoparticles 601 may include one or a combination of $TiO_2$ and $SiO_2$. Of course, the inorganic nanoparticles may also be other materials that have a scattering effect, which are not enumerated herein.

During the implementation, in the display panel of the embodiments of the present disclosure, as shown in FIGS. 2-5, the light-emitting element 3 may be a blue light-emitting element, and the color conversion part may include a red quantum dot color film 71, a green quantum dot color film 72 and a scattering particle film 73. Since red, green and blue primary colors are used to realize light emission, and the light-emitting element 3 is a blue light-emitting element, it does not require to provide a blue quantum dot color film at a position that a blue quantum dot color film should be provided and it only requires to fill scattering particles. It is able for the scattering particles to improve the light-emitting viewing angle.

During the implementation, in the display panel of the embodiments of the present disclosure, as shown in FIG. 5, the display panel further includes a reflective structure 9 covering the pixel isolation structure 6, the reflective structure 9 is made of a metal material, and the metal material may be used for reflecting light on the one hand, improving the light efficiency utilization rate of the quantum dot color film layer, and addressing the issue of ink cross-talk between adjacent sub-pixel regions 11 on the other hand. Through the reflective structure 9, it is able to improve the light reflectivity, and thus improve the light extraction effect. The reflectivity of the reflective structure 9 to light in the visible light band (380 nm-780 nm) is preferably 50%-70%.

During the implementation, the material of the reflective structure may be, but not limited to, silver, aluminum or an alloy thereof, and the thickness of the reflective structure 9 ranges from 200 nm to 400 nm.

Note that in FIG. 5, the reflective structure 9 is only provided when the color of the pixel isolation structure 6 is yellow, and of course, the reflective structure 9 may be also provided when the color of the pixel isolation structure 6 is black or gray.

Figure 7:
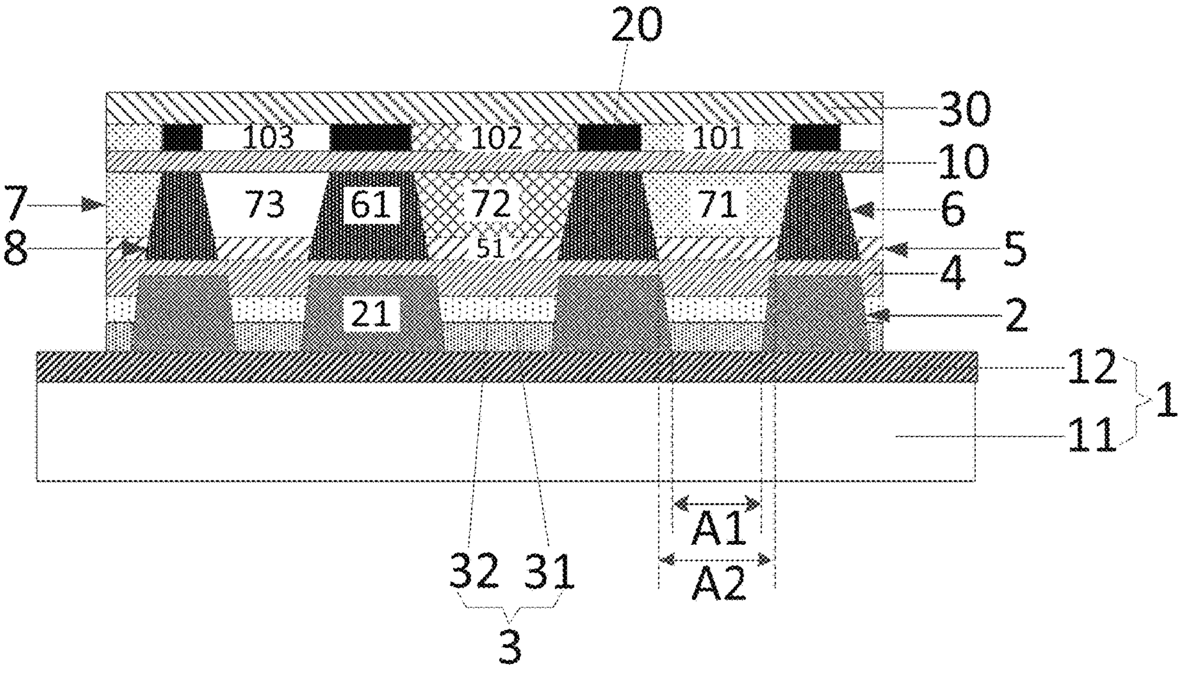
FIG. 7 is still yet another schematic view showing the display panel according to one embodiment of the present disclosure.

During the implementation, in the display panel of the embodiment of the present disclosure, as shown in FIG. 7, the pixel isolation structure 6 may be made of a same material as the light shielding parts 81, for example, both being made of a black matrix material (BM), so that the pixel isolation structure 6 and the light shielding parts 81 may be formed as a one-piece structure. In this way, it is able to form the pixel isolation structure 6 and the light shielding parts 81 through one patterning process, without adding a separate process for forming the pixel isolation structure 6, so as to simplify the procedure process, save the production cost, and improve the production efficiency.

During the implementation, when an OLED display panel is in a screen-off state, in order to improve product grades and market competitiveness, it is required that a viewing region of the display panel is darker when the display panel is viewed from the outside and inwards. Since blue light exists in ambient light, the blue light in the ambient light will excite the quantum dot color film to emit light when the screen-off state is performed. Therefore, in the display panel of the embodiments of the present disclosure, as shown in FIGS. 1-5 and 7, the display panel further includes: a second encapsulation layer 10 covering the color conversion layer 7 and the pixel isolation structure 6, a plurality of color filter parts (101, 102, 103) arranged on the side of the second encapsulation layer 10 away from the driving substrate 1 and corresponding to the color conversion parts (71, 72, 73), and a second light shielding layer 20 arranged between the color filter parts (101, 102, 103). Specifically, a red color filter part 101 is provided at a position corresponding to a red quantum dot color film 71, a green color filter part 102 is provided at a position corresponding to a green quantum dot color film 72, and a blue color filter part 103 is provided at a position corresponding to a scattering particle film 73, so as to block blue light in the external ambient light when the screen is off, thereby improving product performance.

Specifically, as shown in FIGS. 1-5 and 7, a material that the second encapsulation layer 10 is made of may include $SiO_X$, $SiN_X$ or $Al_2O_3$. A thickness of the second encapsulation layer 10 is less than 1 μm, preferably less than 0.5 μm, and a refractive index of the second encapsulation layer 10 ranges between 1.7-2.0, preferably between 1.75-1.85.

Specifically, as shown in FIGS. 1 to 5 and 7, the color filter parts (101, 102, 103) and the second light shielding layer 20 each has a thicknesses of less than 3 um.

During the implementation, the light-emitting element includes a cathode, and external light passing through the cathode (generally being a metal) may reflect light back, so that a person may see himself/herself from a picture, thereby affecting the viewing effect and contrast. Therefore, in order to prevent light reflection, in the display panel of the embodiments of the present disclosure, as shown in FIGS. 1-5 and 7, the display panel further includes: a polarizer 30 arranged on a side of the plurality of color filter parts (101, 102, 103) away from the driving substrate 1. The polarizer 30 is a reflective polarizer, preferably a reflective polarizer having a slightly higher reflectivity in the blue wavelength band.

During the implementation, as shown in FIGS. 1 to 5 and 7, the driving substrate 1 may be an oxide type thin-film transistor (Oxide TFT) substrate or a low temperature poly-silicon type thin-film transistor (LTPS TFT) substrate. Specifically, the driving substrate 1 includes a base substrate 11 and a thin-film transistor 12 arranged on the base substrate 11. The base substrate 11 may be made of a rigid glass or plastic material. The light-emitting element 3 includes a reflective anode 31 and a light-emitting layer 32 and a cathode (not shown) laminated one on another sequentially in the first pixel region A1, the cathode being generally arranged to be corresponding to an entire face.

During the implementation, as shown in FIGS. 1-5 and 7, the first encapsulation layer 4 may adopt a Thin-Film Encapsulation (TFE), and the first encapsulation layer 4 may include a three-layer laminated structure, with a first layer being an inorganic layer (a SiN or SiON layer), a second layer being an organic layer (IJP) and a third layer being an inorganic layer (a SiN or SiON layer). The light-emitting element may emit light from the top (i.e., a top emitting device) with a wavelength central range of 420 nm to 470 nm and a half-peak width of 10 nm to 30 mm. The first encapsulation layer 4 has a high transparency (e.g., transmittance>90%, preferably transmittance≥95%) and a thickness of less than 10 um (80 ppi-120 ppi).

Figure 8:
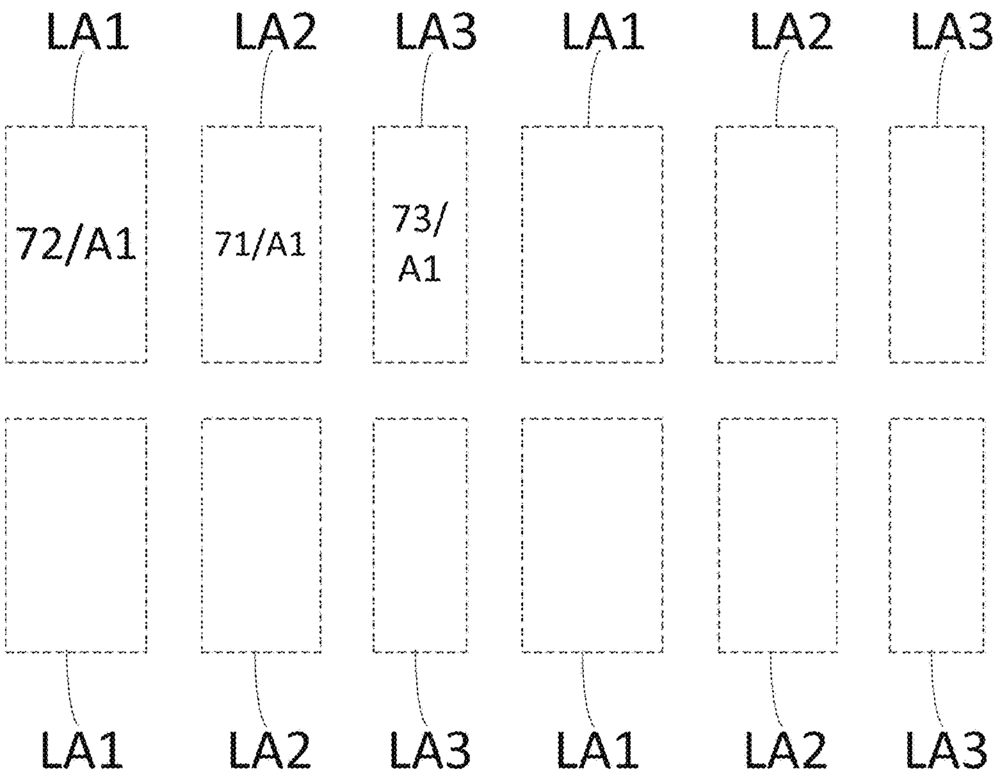
FIG. 8 is a top view of a first pixel region.

During the implementation, as shown in FIG. 8, the pixel definition layer 2 in FIGS. 1-5 and 7 defines multiple first pixel regions A1, an area (LA1) of the first pixel region A1 corresponding to the green quantum dot color film 72≥an area (LA2) of the first pixel region A1 corresponding to the red quantum dot color film 71≥an area (LA3) of the first pixel region A1 corresponding to the scattering particle film 73.

Figure 9:
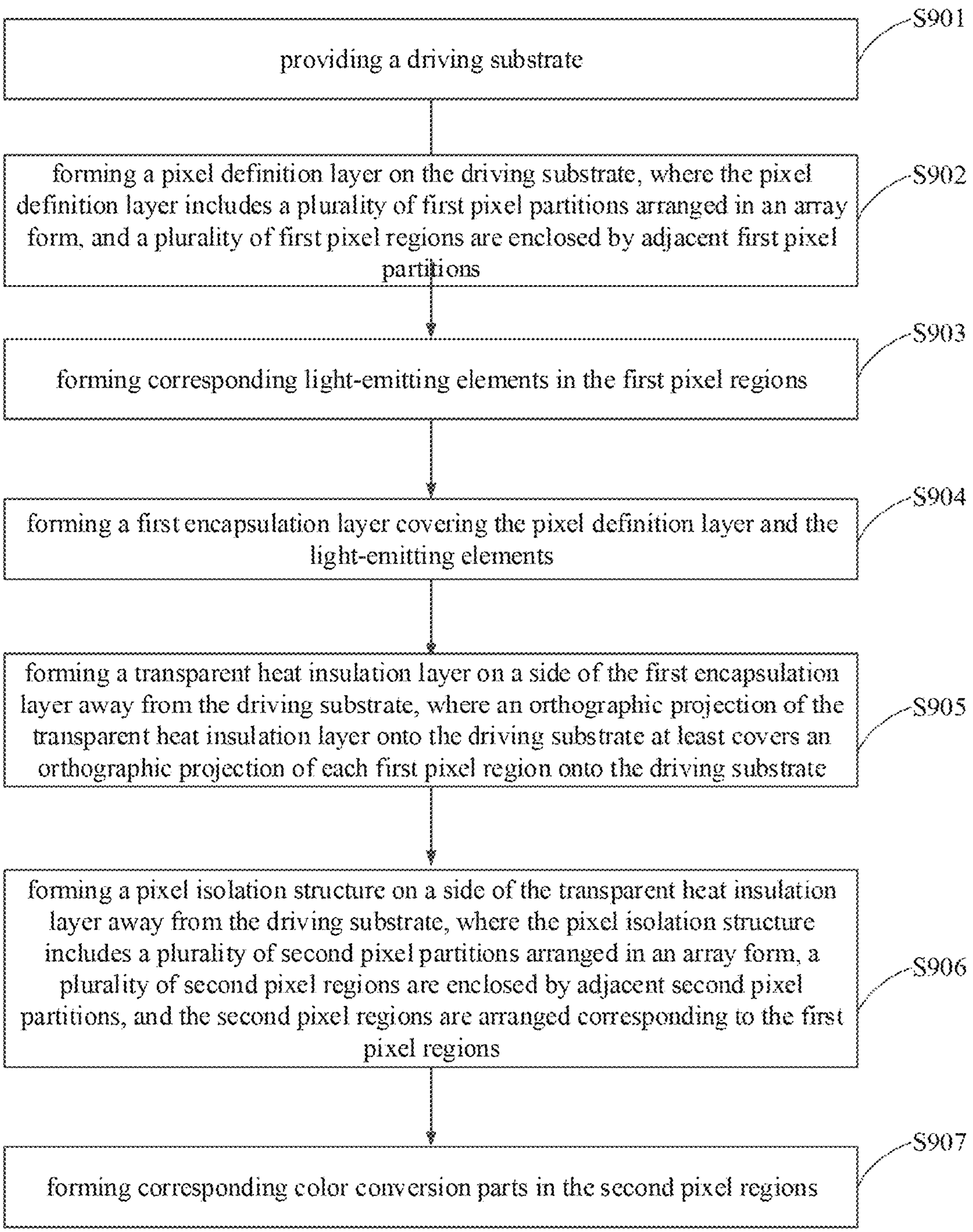
FIG. 9 is a flow chart of a method for manufacturing the display panel according to one embodiment of the present disclosure.

Based on the same inventive concept, embodiments of the present disclosure further provide a method for manufacturing the above-mentioned display panel, as shown in FIG. 9, including:

at S901, providing a driving substrate;

at S902, forming a pixel definition layer on the driving substrate, where the pixel definition layer includes a plurality of first pixel partitions arranged in an array form, and a plurality of first pixel regions are enclosed by adjacent first pixel partitions;

at S903, forming corresponding light-emitting elements in the first pixel regions;

at S904, forming a first encapsulation layer covering the pixel definition layer and the light-emitting elements;

at S905, forming a transparent heat insulation layer on a side of the first encapsulation layer away from the driving substrate, where an orthographic projection of the transparent heat insulation layer onto the driving substrate at least covers an orthographic projection of each first pixel region onto the driving substrate;

at S906, forming a pixel isolation structure on a side of the transparent heat insulation layer away from the driving substrate, where the pixel isolation structure includes a plurality of second pixel partitions arranged in an array form, a plurality of second pixel regions are enclosed by adjacent second pixel partitions, and the second pixel regions are arranged corresponding to the first pixel regions; and at S907, forming corresponding color conversion parts in the second pixel regions.

In the method for manufacturing the display panel of the embodiments of the present disclosure, when the transparent heat insulation layer is formed on the side of the first encapsulation layer away from the driving substrate, it is able for the transparent heat insulation layer to protect the light-emitting elements below the first encapsulation layer from high temperature damage, so that when a pixel isolation structure is subsequently formed, a high temperature curing process can be used to ensure that the material of the pixel isolation structure is fully cured, thereby to address the issue of crosstalk occurring for the color conversion layer caused by incomplete curing of the pixel isolation structure.

Figure 10:
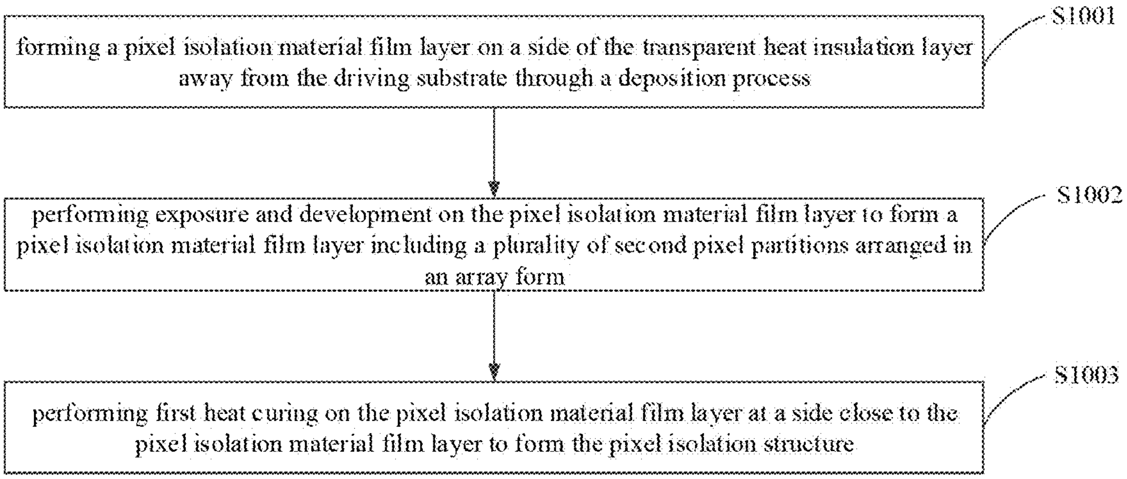
FIG. 10 is another flow chart of the method for manufacturing the display panel according to one embodiment of the present disclosure.

During the implementation, in the method of the embodiments of the present disclosure, the forming a pixel isolation structure on a side of the transparent heat insulation layer away from the driving substrate, as shown in FIG. 10, may specifically include:

at S1001, forming a pixel isolation material film layer on a side of the transparent heat insulation layer away from the driving substrate through a deposition process;

at S1002, performing exposure and development on the pixel isolation material film layer to form a pixel isolation material film layer including a plurality of second pixel partitions arranged in an array form; and at S1003, performing first heat curing on the pixel isolation material film layer at a side close to the pixel isolation material film layer to form the pixel isolation structure.

Figure 11:
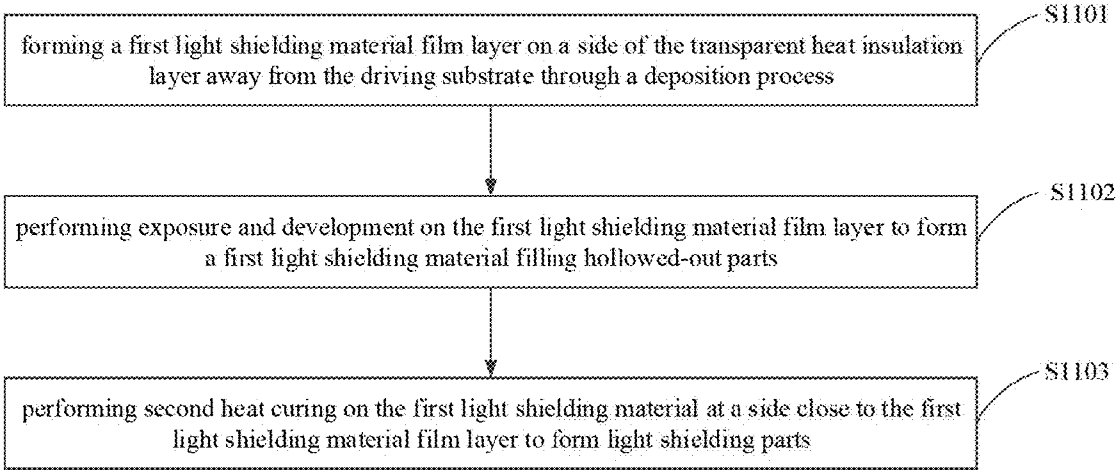
FIG. 11 is yet another flow chart of the method for manufacturing the display panel according to one embodiment of the present disclosure.

During the implementation, in the method of the embodiments of the present disclosure, as shown in FIG. 11, before forming the pixel isolation structure, the method further includes:

at S1101, forming a first light shielding material film layer on a side of the transparent heat insulation layer away from the driving substrate through a deposition process;

at S1102, performing exposure and development on the first light shielding material film layer to form a first light shielding material filling hollowed-out parts;

at S1103, performing second heat curing on the first light shielding material at a side close to the first light shielding material film layer to form light shielding parts.

During the implementation, in the method of the embodiments of the present disclosure, the transparent heat insulation layer and the first light shielding layer are formed by using a same mask, thereby saving one mask and saving costs.

During the implementation, in the method of the embodiments of the present disclosure, a temperatures of the first heat curing and a temperature of the second heat curing may be the same or different, which depends on the material, and the temperature and time of the heating may depend primarily on the selected material itself of the light shielding part and pixel isolation structure. In one possible embodiment, for example, where a heat source is relatively far from the light-emitting element during the first heat curing, and the heat source is relatively close to the light-emitting element during the first heat curing, the temperature of the first heat curing may be increased as appropriate, so that the temperature of the first heat curing may be greater than the temperature of the second heat curing. However, it is noted that specific temperatures may depend on the curing degrees in the two curing processes.

Figure 12A:
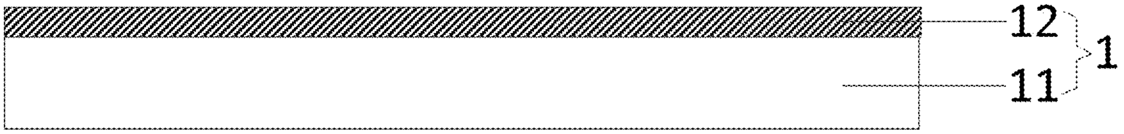
FIGS. 12A-12K are schematic views showing the display panel after performing each step of the method for manufacturing the display panel according to one embodiment of the present disclosure.

A method for manufacturing the display panel in FIG. 2 is described in detail as follows:

(1) A driving substrate 1 is manufactured, specifically, a thin-film transistor 12 is manufactured on a base substrate 11, and as shown in FIG. 12A, the specific manufacturing method is the same as that in the prior art, which will not be described in detail herein.

Figure 12B:
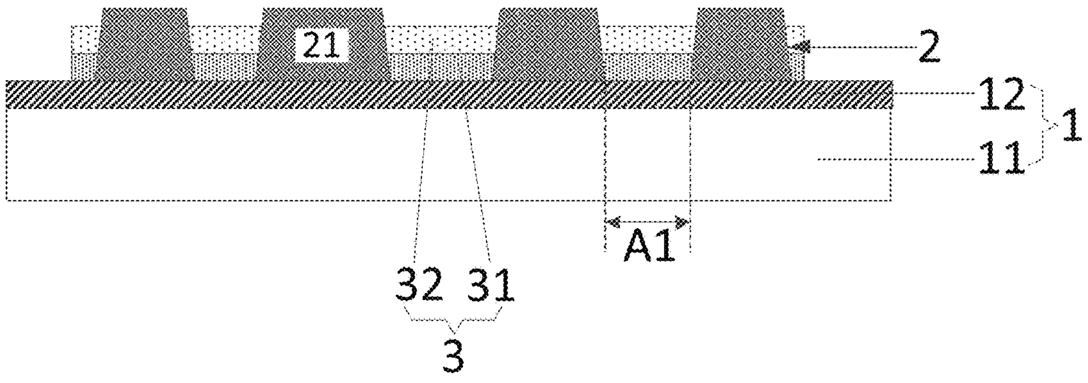

(2) A pixel definition layer 2, a reflective anode 31, a light-emitting layer 32 and a cathode (not shown) are sequentially formed on the driving substrate 1, as shown in FIG. 12B. Specifically, the pixel definition layer 2 includes a plurality of first pixel partitions 21 arranged in an array form, first pixel regions A1 are enclosed by adjacent first pixel partitions 21, the reflective anode 31 and the light-emitting layer 32 are arranged in each first pixel region A1, and the cathode fully covers the pixel definition layer 2 and the light-emitting element 3 (the reflective anode 31 and the light-emitting layer 32) in a manner of corresponding to an entire face. The manufacturing methods of the pixel definition layer 2, the reflective anode 31, the light-emitting layer 32 and the cathode are the same as those in the prior art, which are not described in detail herein.

Figure 12C:
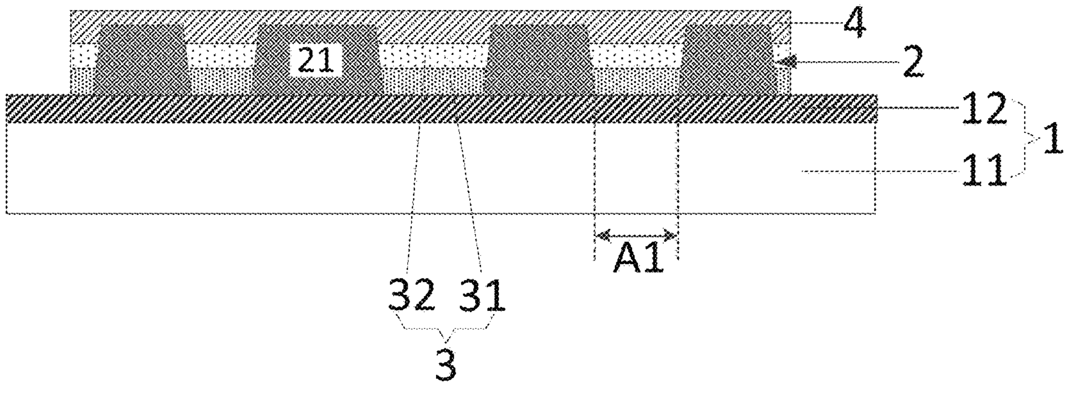

(3) A first encapsulation layer 4 is formed on a side of the cathode away from the driving substrate 1, as shown in FIG. 12C. In specific, the first encapsulation layer 4 may include a three-layer laminated structure, with a first layer being an inorganic layer (SiN or SiON layer), a second layer being an organic layer (IJP) and a third layer being an inorganic layer (SiN or SiON layer).

Figure 12D:
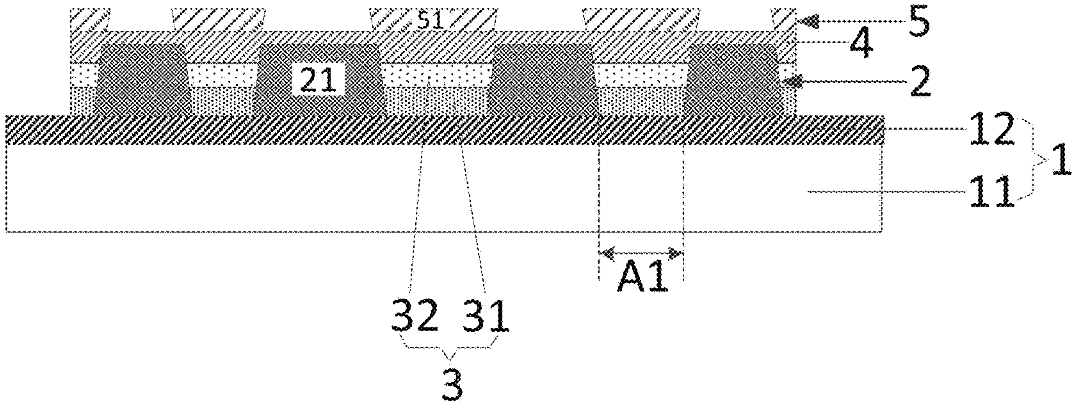

(4) A transparent heat insulation layer 5 is formed on a side of the first encapsulation layer 4 away from the driving substrate 1, and the transparent heat insulation layer 5 has a plurality of hollowed-out parts and heat insulation parts 51, as shown in FIG. 12D. Specifically, the material of the transparent heat insulation layer 5 may be a negative photoresist with thermal insulation properties or a phase change material doped in the photoresist, so that the plurality of hollowed-out parts and beat insulation parts 51 in the transparent heat insulation layer 5 may be formed by using a single mask through exposure and development process.

Figure 12E:
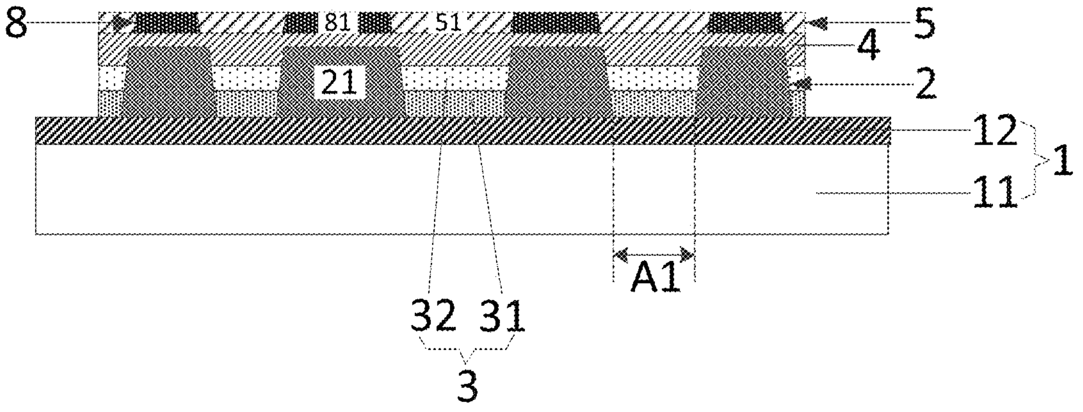

(5) Light shielding part 81 are manufactured in the hollowed-out parts of the transparent heat insulation layer 5, as shown in FIG. 12E. Specifically, the material of the light shielding part 81 is a positive photoresist, and the light shielding parts 81 filling the hollowed-out parts are formed through an exposure and development process by using a same mask as that for the heat insulation part 51.

Figure 12F:
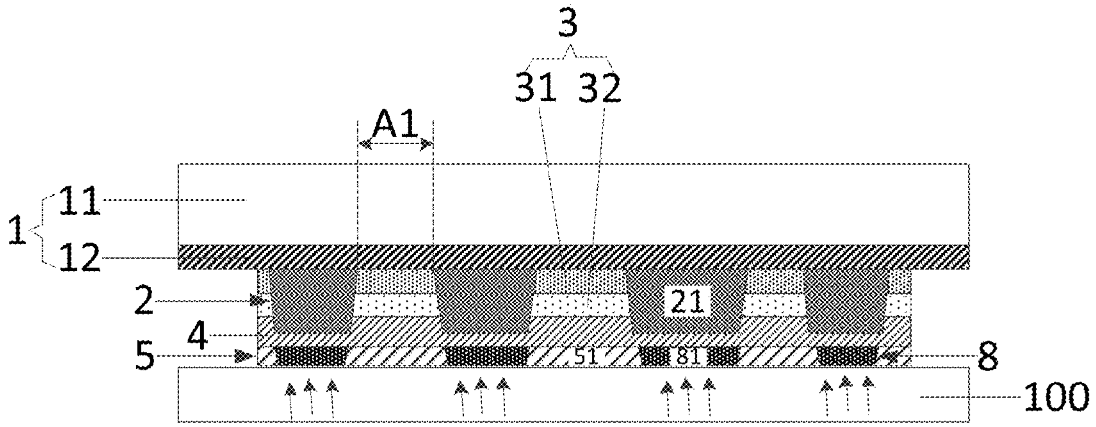

(6) The structure formed in step (5) is vertically inverted, and a second heat curing (indicated by an arrow) is performed on the light shielding parts 81, and a temperature thereof may be greater than or equal to 180° C., as shown in FIG. 12F, where a structure denoted by reference numeral 100 in FIG. 12F is a heat curing device.

Figure 12G:
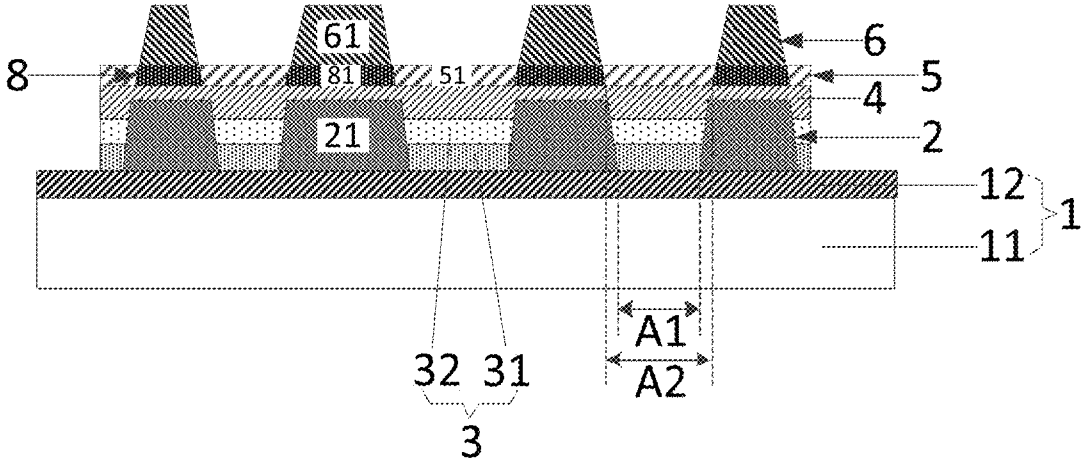

(7) The pixel isolation structure 6 is formed on a side of the cured light shielding parts 81 away from the driving substrate 1 through exposure and development, the pixel isolation structure 6 is made of a resin material, the pixel isolation structure 6 has second pixel partitions 61 arranged in an array form, and a plurality of second pixel regions A2 are enclosed by adjacent second pixel partitions 61, as shown in FIG. 12G.

Figure 12H:
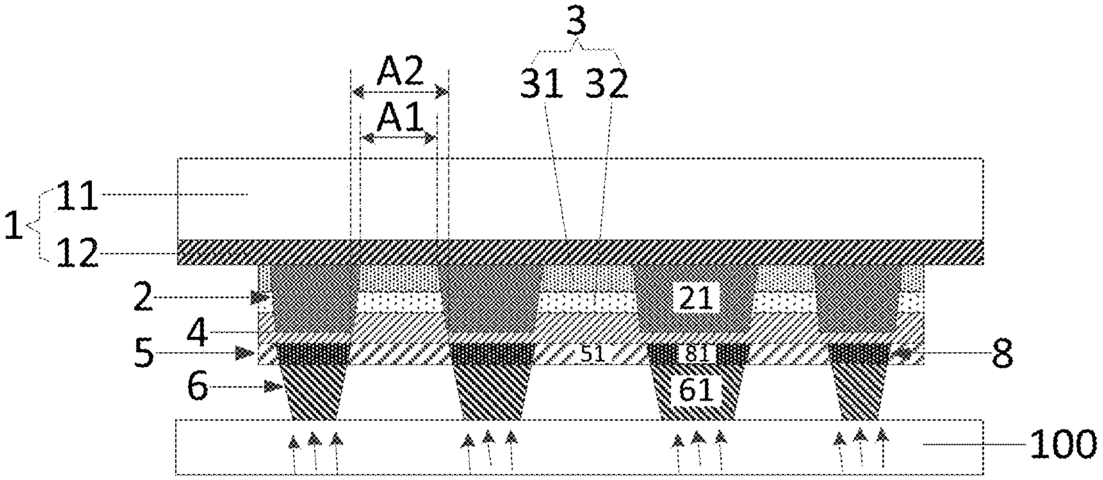

(8) The structure formed in step (7) is vertically inverted, and a first heat curing is performed on the pixel isolation structure 6 (indicated by an arrow), where a temperature thereof may be greater than or equal to 180° C., as shown in FIG. 12H, and a structure denoted by reference numeral 100 in FIG. 12H is a heat curing device. Specifically, the temperature of the first heat curing may be greater than the temperature of the second heat curing.

Figure 12I:
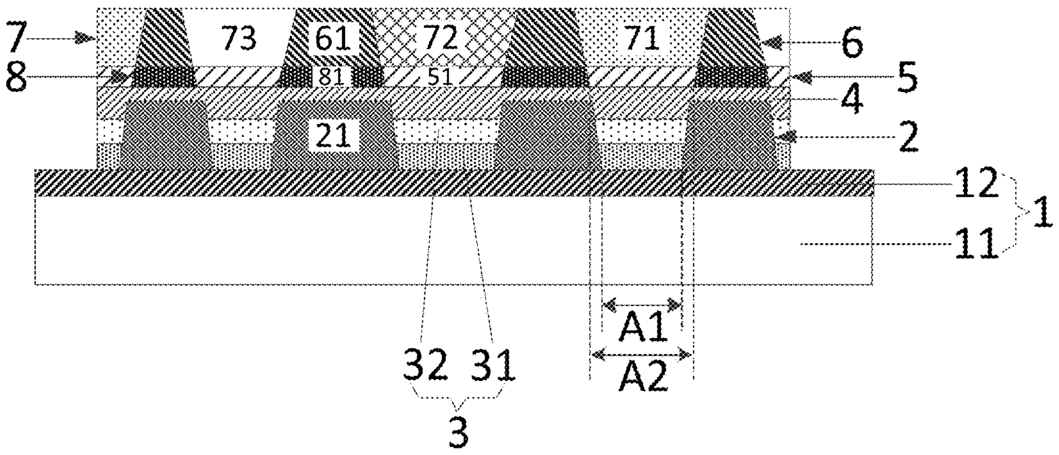

(9) Corresponding red quantum dot color films 71, green quantum dot color films 72 and scattering particle films 73 are formed in the second pixel regions A2 formed in step (8), and the red quantum dot color films 71, green quantum dot color films 72 and scattering particle films 73 form the color conversion layer 7, as shown in FIG. 12I.

Figure 12J:
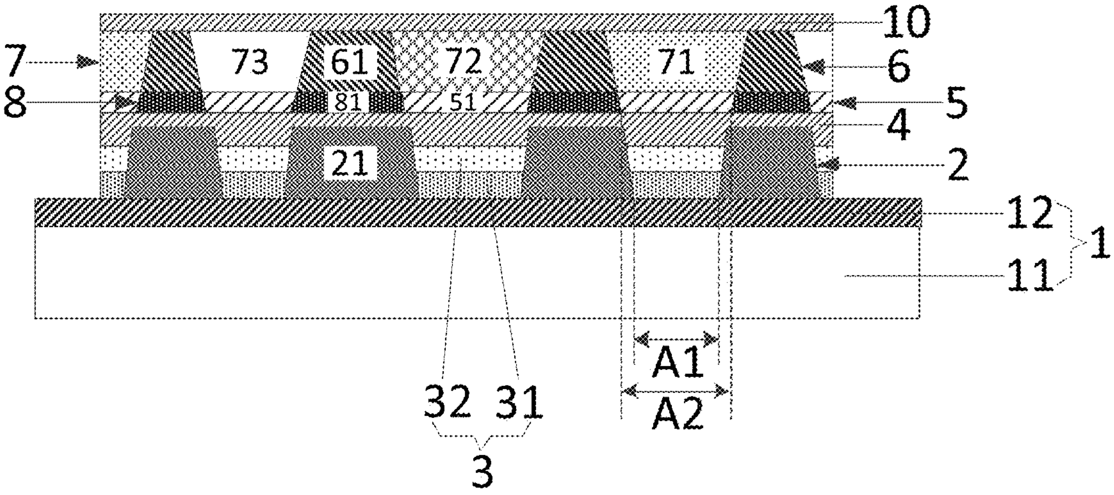

(10) A second encapsulation layer 10 is formed above the structure formed in step (9), as shown in FIG. 12J. In specific, the material of the second encapsulation layer 10 may include $SiO_X$, $SiN_X$ or $Al_2O_3$.

Figure 12K:
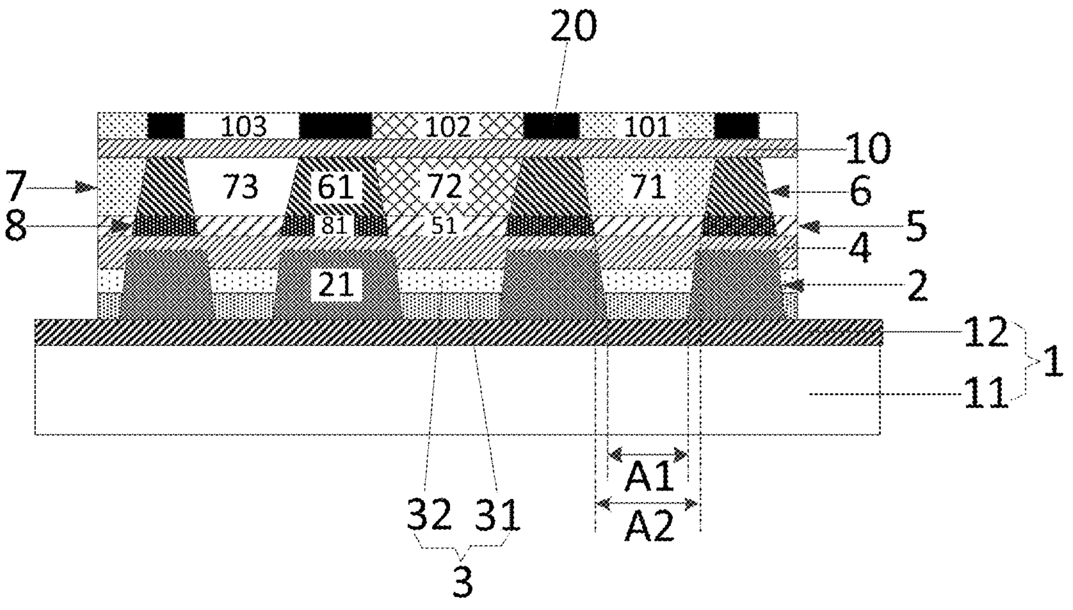
Figure 13:
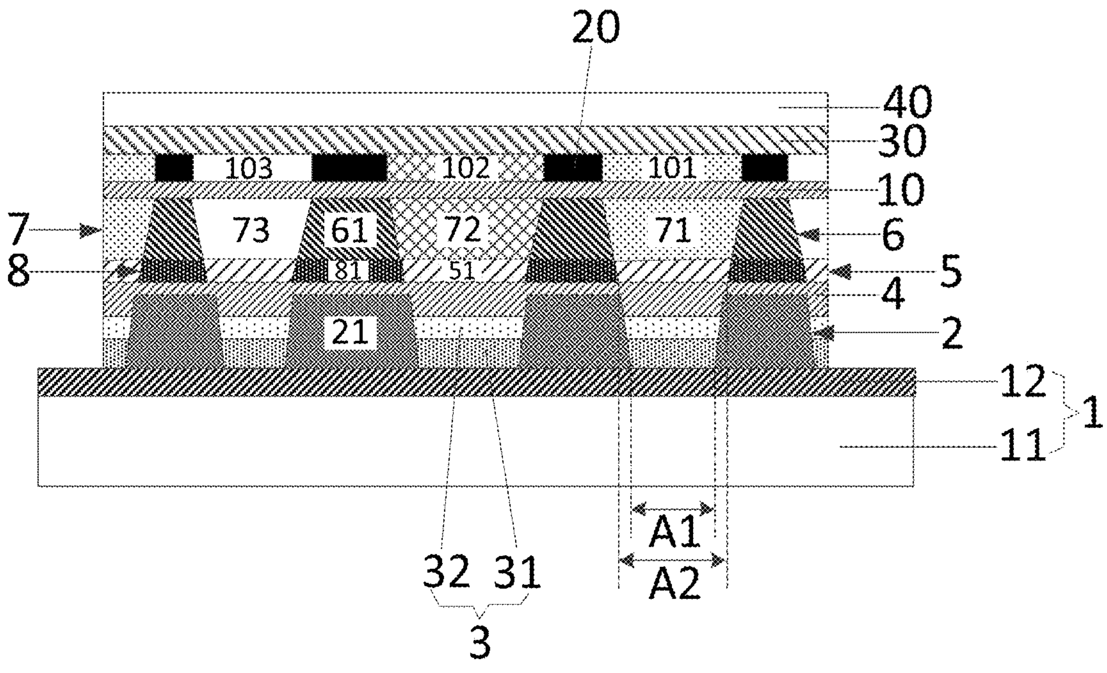
FIG. 13 is a schematic view showing a display device according to one embodiment of the present disclosure.
Figure 14:
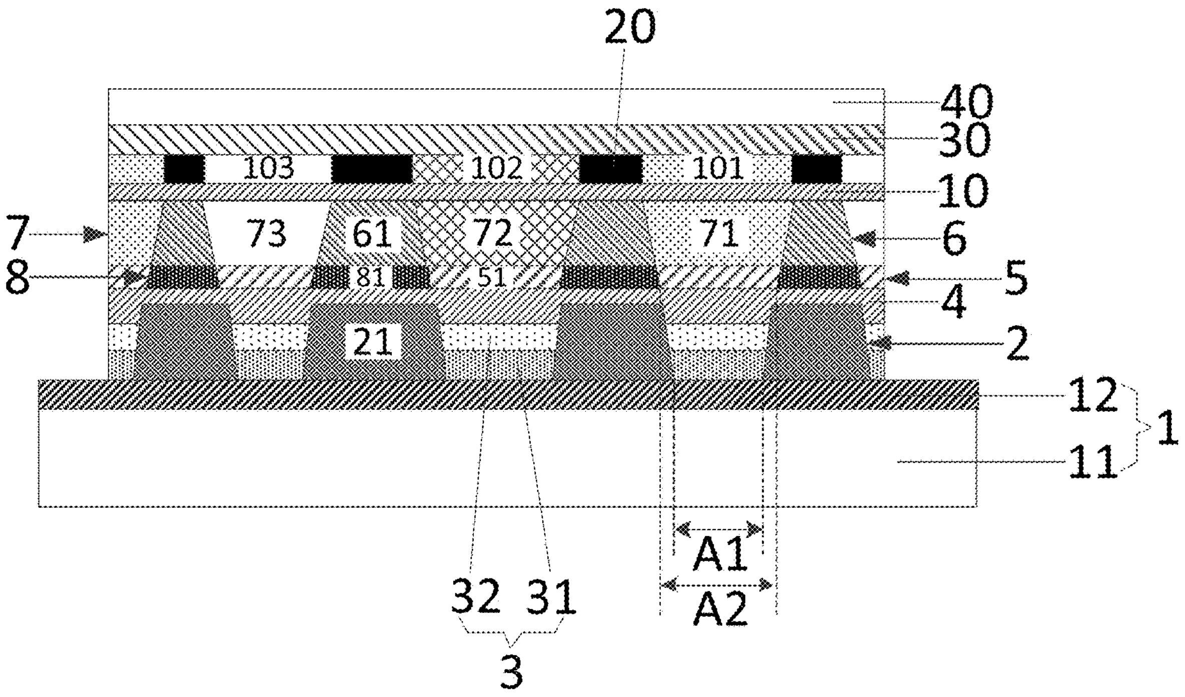
FIG. 14 is another schematic view showing the display device according to one embodiment of the present disclosure.
Figure 15:
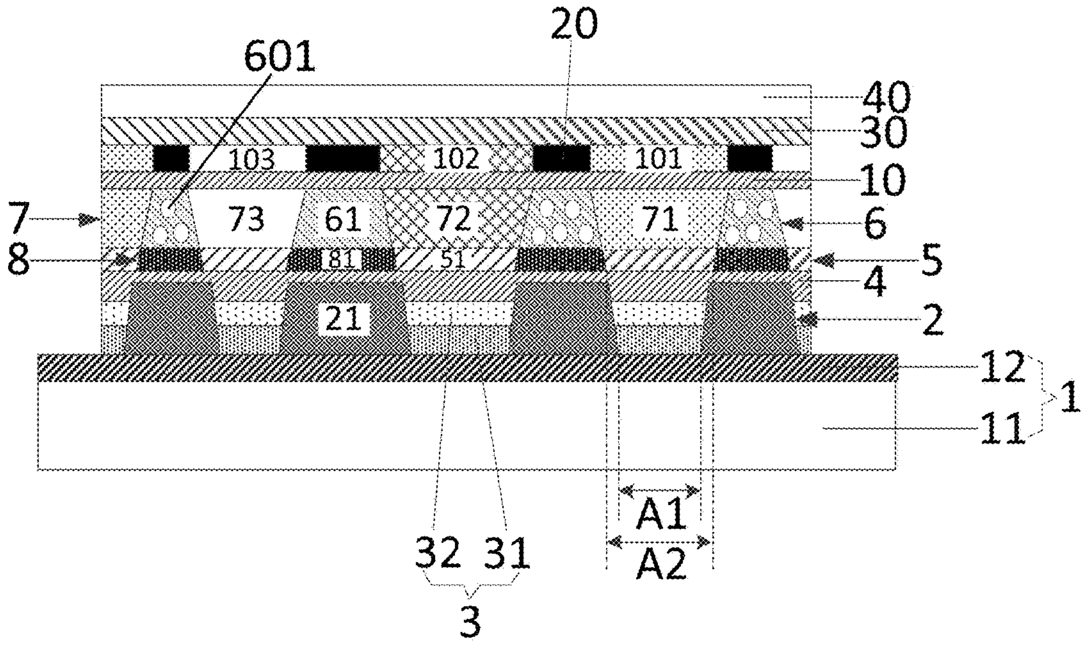
FIG. 15 is yet another schematic view showing the display device according to one embodiment of the present disclosure.
Figure 16:
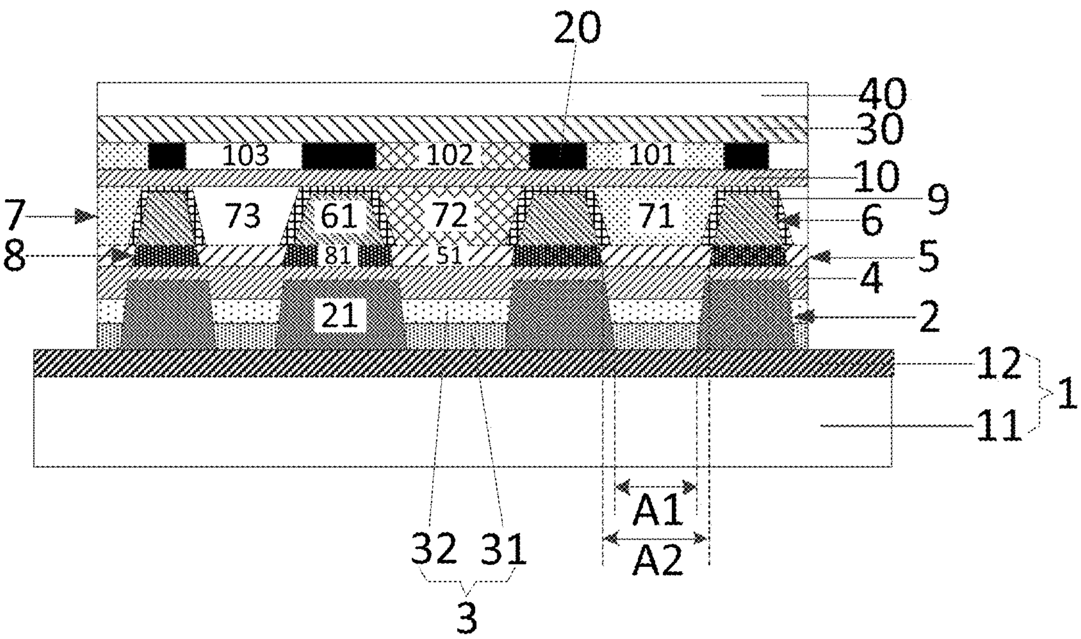
FIG. 16 is still yet another schematic view showing the display device according to one embodiment of the present disclosure.
Figure 17:
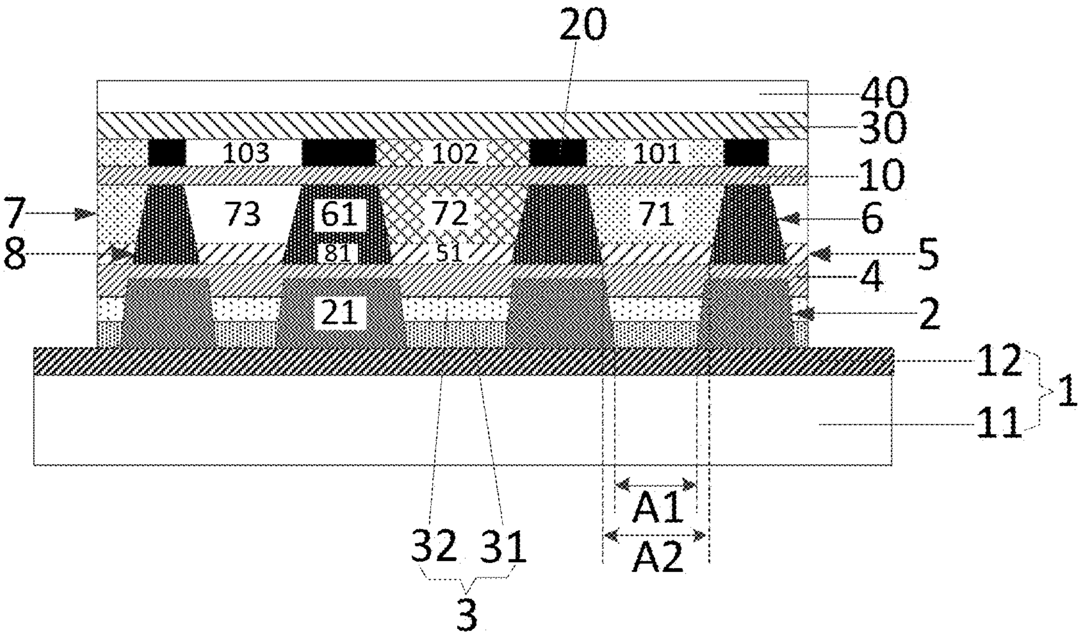
FIG. 17 is still yet another schematic view showing the display device according to one embodiment of the present disclosure.

(11) A second light shielding layer 20 corresponding to the second pixel partitions 61 is formed on a side of the second encapsulation layer 10 away from the driving substrate 1, and color filter parts (101, 102 and 103) corresponding to the red quantum dot color film 71, the green quantum dot color film 72 and the scattering particle film 73 are formed between the second light shielding layers 20, as shown in FIG. 12K.

(12) A polarizer 13 is formed on the structure formed in step (11), as shown in FIG. 2.

Based on the same inventive concept, embodiments of the present invention further provide a display device including the above-mentioned display panel in the embodiments of the present invention.

During the implementation, in the display device of the embodiments of the present disclosure, as shown in FIGS. 13 to 17, the display device may further include a cover plate 40 covering the display panel. Specifically, the cover plate 40 may be a rigid cover plate or a flexible cover plate.

The display device may be any product or member with display function such as mobile phone, tablet computer, television, display, laptop computer, digital photo frame, or navigator. As can be appreciated by a person skilled in the art, the display device further include other essential member, which are not described in detail herein and should not be construed as limiting the present disclosure. The display device has a similar principle for solving the problem as the quantum dot light-emitting element, and therefore the implementation of the display device may refer to the implementation of the display panel, which will not be particularly defined herein.

In the display panel, the method for manufacturing the display panel, and the display device of the embodiments of the present disclosure, when the transparent heat insulation layer is arranged on the side of the first encapsulation layer away from the driving substrate, it is able for the transparent heat insulation layer to protect the light-emitting elements below the first encapsulation layer from being damaged by a high temperature, so that when a pixel isolation structure is subsequently formed, a high-temperature curing process can be used to ensure that the material of the pixel isolation structure is fully cured, thereby to address the issue of crosstalk occurring for the color conversion layer caused by the incomplete curing of the pixel isolation structure.

While the preferred embodiments of the present disclosure are described, additional variations and modifications to these embodiments may occur to those skilled in the art once the basic inventive concepts are known. It is therefore intended that the following appended claims are interpreted as including the preferred embodiments and all the variations and modifications which fall within the scope of the present disclosure.

Apparently, modifications and variations of the embodiments of the present disclosure may be made by those skilled in the art without departing from the spirit or scope of the embodiments of the present disclosure. Thus, in case that the modifications and variations of the embodiments of the present disclosure fall within the scope of the claims of the present disclosure and equivalent technologies thereof, the present disclosure is also intended to include these modifications and variations.

What is claimed is:

1. A display panel, comprising:

a driving substrate;

a pixel definition layer arranged on one side of the driving substrate, wherein the pixel definition layer comprises a plurality of first pixel partitions arranged in an array form, and a plurality of first pixel regions are enclosed by adjacent first pixel partitions;

a plurality of light-emitting elements arranged in corresponding first pixel regions;

a first encapsulation layer covering the pixel definition layer and the plurality of light-emitting elements;

a transparent heat insulation layer arranged on a side of the first encapsulation layer away from the driving substrate, wherein an orthographic projection of the transparent heat insulation layer onto the driving substrate at least covers an orthographic projection of each first pixel region onto the driving substrate;

a pixel isolation structure arranged on a side of the transparent heat insulation layer away from the driving substrate, wherein the pixel isolation structure comprises a plurality of second pixel partitions arranged in an array form, a plurality of second pixel regions are enclosed by adjacent second pixel partitions, and the second pixel regions are arranged corresponding to the first pixel regions; and a color conversion layer comprising a plurality of color conversion parts arranged in corresponding second pixel regions, wherein the transparent heat insulation layer has a plurality of hollowed-out parts and a plurality of heat insulation parts, and an orthographic projection of each heat insulation part onto the driving substrate covers an orthographic projection of a corresponding first pixel region onto the driving substrate.

2. The display panel according to claim 1, further comprising a first light shielding layer, wherein the first light shielding layer comprises light shielding parts filling the hollowed-out parts, and an orthographic projection of the pixel isolation structure onto the driving substrate covers orthographic projections of the light shielding parts onto the driving substrate.

3. The display panel according to claim 2, wherein a material of the first light shielding layer is a positive photoresist, a material of the transparent heat insulation layer is a negative photoresist with thermal insulation properties, or a material of the transparent heat insulation layer comprises a negative photoresist body and a phase change material mixed in the negative photoresist body.

4. The display panel according to claim 3, wherein the phase change material is an organic phase change material, the organic phase change material comprising paraffin, medium-long-chain fatty acids, polyolefins or alcohols.

5. The display panel according to claim 2, wherein, in a thickness direction of the driving substrate, a cross-sectional shape of at least one light shielding part is substantially a right trapezoid and a cross-sectional shape of the heat insulation part is substantially an inverted trapezoid.

6. The display panel according to claim 2, wherein the first light shielding layer and the transparent heat insulation layer each has a thickness of 2 μm to 3 μm.

7. The display panel according to claim 2, wherein a thickness of the pixel isolation structure is 2-5 times the thickness of the transparent heat insulation layer.

8. The display panel according to claim 2, wherein a color of the pixel isolation structure is one of black, yellow or gray.

9. The display panel according to claim 8, wherein the pixel isolation structure has inorganic nanoparticles therein for scattering light entering sidewalls of the pixel isolation structure.

10. The display panel according to claim 2, wherein the pixel isolation structure is made of a same material as the light shielding parts, and the pixel isolation structure and the light shielding parts form a one-piece structure.

11. The display panel according to claim 1, further comprising: a second encapsulation layer covering the color conversion layer and the pixel isolation structure, a plurality of color filter parts arranged on a side of the second encapsulation layer away from the driving substrate and corresponding to the color conversion parts, and a second light shielding layer arranged between the color filter parts.

12. A display device, comprising the display panel according to claim 1.

13. The display device according to claim 12, further comprising a cover plate covering the display panel.

14. A method for manufacturing the display panel according to claim 1, comprising:

providing a driving substrate;

forming a pixel definition layer on the driving substrate; wherein the pixel definition layer comprises a plurality of first pixel partitions arranged in an array form, and a plurality of first pixel regions are enclosed by adjacent first pixel partitions;

forming corresponding light-emitting elements in the first pixel regions;

forming a first encapsulation layer covering the pixel definition layer and the light-emitting elements;

forming a transparent heat insulation layer on a side of the first encapsulation layer away from the driving substrate; wherein an orthographic projection of the transparent heat insulation layer onto the driving substrate at least covers an orthographic projection of each first pixel region onto the driving substrate;

forming a pixel isolation structure on a side of the transparent heat insulation layer away from the driving substrate, wherein the pixel isolation structure comprises a plurality of second pixel partitions arranged in an array form, a plurality of second pixel regions are enclosed by adjacent second pixel partitions, and the second pixel regions are arranged corresponding to the first pixel regions; and forming corresponding color conversion parts in the second pixel regions.

15. The method according to claim 14, wherein the forming a pixel isolation structure on a side of the transparent heat insulation layer away from the driving substrate, specifically comprises:

forming a pixel isolation material film layer on a side of the transparent heat insulation layer away from the driving substrate through a deposition process;

performing exposure and development on the pixel isolation material film layer to form a pixel isolation material film layer comprising a plurality of second pixel partitions arranged in an array form; and performing first heat curing on the pixel isolation material film layer on a side of the pixel isolation material film layer away from the transparent heat insulation layer to form the pixel isolation structure.

16. The method according to claim 15, wherein before forming the pixel isolation structure, the method further comprises:

forming a first light shielding material film layer on a side of the transparent heat insulation layer away from the driving substrate through a deposition process;

performing exposure and development on the first light shielding material film layer to form a first light shielding material filling hollowed-out parts;

performing second heat curing on the first light shielding material on a side of the first light shielding material film layer away from the transparent heat insulation layer to form light shielding parts.

17. The method according to claim 16, wherein the transparent heat insulation layer and the first light shielding layer are formed by using a same mask.

18. The method according to claim 16, wherein a temperature of the first heat curing is greater than a temperature of the second heat curing.

* * * * *